US009766617B2

(12) United States Patent
Ogawa et al.

(10) Patent No.: US 9,766,617 B2
(45) Date of Patent: Sep. 19, 2017

(54) SUBSTRATE PROCESSING APPARATUS

(71) Applicant: TOKYO ELECTRON LIMITED, Tokyo (JP)

(72) Inventors: Junichi Ogawa, Nirasaki (JP); Youichi Nakayama, Nirasaki (JP); Keiji Osada, Nirasaki (JP); Hiroaki Dewa, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 429 days.

(21) Appl. No.: 14/063,341

(22) Filed: Oct. 25, 2013

(65) Prior Publication Data

US 2014/0121814 A1 May 1, 2014

(30) Foreign Application Priority Data

Oct. 29, 2012 (JP) ................................ 2012-237875

(51) Int. Cl.
*H01L 21/67* (2006.01)
*G05B 19/418* (2006.01)

(52) U.S. Cl.
CPC ................. *G05B 19/41865* (2013.01); *G05B 2219/45031* (2013.01); *H01L 21/67276* (2013.01); *Y02P 90/20* (2015.11)

(58) Field of Classification Search
CPC ...... G06Q 10/06; G06Q 10/04; G06Q 10/087; G05B 19/41865; G05B 2219/45031
USPC .......................................................... 700/100
See application file for complete search history.

(56) References Cited

U.S. PATENT DOCUMENTS 6,201,999 B1 * 3/2001 Jevtic .................. G03F 7/70533 700/100
6,889,110 B1 * 5/2005 Jain .................. G05B 19/41865 700/100
2004/0129300 A1 * 7/2004 Ohshimo ........... B65G 49/0481 134/61

(Continued)

FOREIGN PATENT DOCUMENTS

JP 10-149990 A 6/1998
JP 2004174669 A 6/2004

(Continued)

*Primary Examiner* — Ryan Jarrett
(74) *Attorney, Agent, or Firm* — Nath, Goldberg & Meyer; Jerald L. Meyer

(57) ABSTRACT

The substrate processing apparatus includes: a plurality of processing modules; a transfer mechanism; a controller; and a setting unit. The processing module processes with respect to the substrate. The transfer mechanism transfers the substrate ejected from the transfer container. The controller outputs control signals for transferring the substrate to the plurality of processing modules along a previously set transfer path through the transfer mechanism sequentially, and for processing with respect to the substrate in the processing module of a transfer destination based on a processing recipe in which a processing order and a processing condition are set. The setting unit sets a content of a non-recipe operation except for operations set in the processing recipe and a performing timing for performing the non-recipe operation by a control operation of the controller every processing module. The non-recipe operation is performed with respect to the processing modules.

6 Claims, 16 Drawing Sheets

1
PM2
PM3
G4
131
PM1
W
G4
PM4
G4
G4
13
LLM1
16
G3 G3
LLM2
G2
G2
12
14
121
15
G1
controller
2
G1
G1
C
11

(56) References Cited

U.S. PATENT DOCUMENTS

2006/0155412 A1* 7/2006 Ikeda ............... G05B 19/41865 700/112
2007/0004052 A1* 1/2007 Wada .................. G03F 7/70991 438/5
2008/0202260 A1* 8/2008 Yamamoto ........ H01L 21/67745 73/863.01
2008/0229386 A1* 9/2008 Yonebayashi ......... G06F 21/604 726/1
2009/0143890 A1* 6/2009 Morisawa ........... C23C 16/4404 700/108
2011/0172800 A1* 7/2011 Koizumi ........... H01L 21/67253 700/100

FOREIGN PATENT DOCUMENTS

JP 2007-250791 A 9/2007
KR 1020020005414 A 1/2002

* cited by examiner 2
22
21
CPU
31
system recipe
321
PM1 conditioning table
322
PM4 conditioning table
33
maintenance macro
341
transfer system conditioning table
35
processing recipe
PM1
PM2
PM3
PM4
13
LL1
LL2
12
15
11
14

FIG. 3

31 system recipe

| | elements | contents | | setting items |
|---|---|---|---|---|
| 36 | transfer path | transfer path of wafers | | LLM1~LLM2, PM1~PM4 |
| 35 | processing recipe | processing condition | | pressure, flow rate of process gas, process time, etc. |
| 32 | PM conditioning recipe | performing timing | | prologue, before carry-in, after carry-in, before carry-out, after carry-out, epilogue |
| | | performing contents | performing conditions | each time, the number of sheets of wafers treatment film thickness, etc. |
| | | | performing period | every carrier (CA), every wafer (WS) |
| | | | maintenance macro | command into PM and performing order |
| 34 | transfer system conditioning recipe | performing timing | | prologue, epilogue |
| | | performing contents | performing conditions | each time, the number of sheets of wafers, etc. |
| | | | performing period | CA, WS |
| | | | maintenance macro | command into transfer system and performing order thereof |

PM types: Ti film formation macro name: Cond/Leak Rate

| step | operation | command | setting 1 | setting 2 | setting 3 |
|---|---|---|---|---|---|
| 1 | Command | leak rate | — | — | — |
| 2 | Command | CM zero point adjustment | having selection | — | — |
| 3 | Command | recipe | TempStab | — | — |
| 4 | End | — | — | — | — |
| ⋮ | ⋮ | ⋮ | ⋮ | ⋮ | ⋮ |
| 80 | End | — | — | — | — |

FIG. 5

PM1
PM types : Ti film formation
macro name : Cond/Before

| step | operation | command | setting 1 | setting 2 | setting 3 |
|---|---|---|---|---|---|
| 1 | Command | recipe | TempSlab | — | — |
| 2 | Command | recipe | Precoat | — | — |
| 3 | End | — | — | — | — |
| ⋮ | ⋮ | ⋮ | ⋮ | ⋮ | ⋮ |
| 80 | End | — | — | — | — |

FIG. 6

PM conditioning table 321, 322

| performing timing | performing order | performing contents |
|---|---|---|
| prologue | No.1 | performing conditions+ performing period+ maintenance macro |
| | ⋮ | |
| | No.10 | |
| conditioning operation before carry-in | No.1 | |
| | ⋮ | |
| | No.10 | |
| conditioning operation after carry-in | No.1 | |
| | ⋮ | |
| | No.10 | |
| conditioning operation before carry-out | No.1 | |
| | ⋮ | |
| | No.10 | |
| conditioning operation after carry-out | No.1 | |
| | ⋮ | |
| | No.10 | |
| epilogue | No.1 | |
| | ⋮ | |
| | No.10 | |

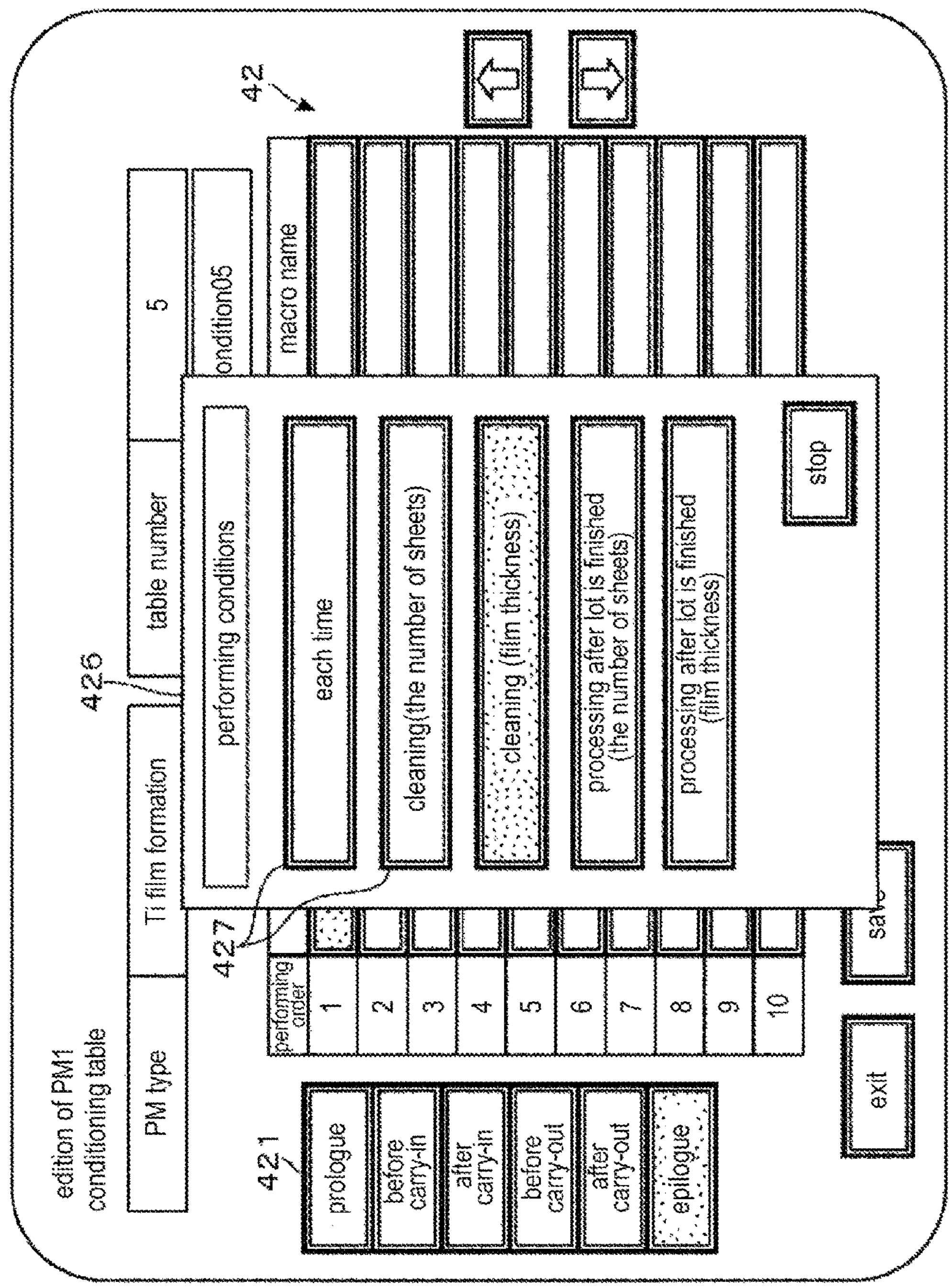
FIG. 10
42
edition of PM1 conditioning table
PM type
Ti film formation
426
table number
5
ondition05
macro name
performing conditions
each time
cleaning(the number of sheets)
cleaning (film thickness)
processing after lot is finished (the number of sheets)
processing after lot is finished (film thickness)
stop
427
performing order
1
2
3
4
5
6
7
8
9
10
421
prologue
before carry-in
after carry-in
before carry-out
after carry-out
epilogue
exit

SUBSTRATE PROCESSING APPARATUS

CROSS-REFERENCE TO RELATED APPLICATION

This application claims the benefit of and priority from Japanese Patent Application No. 2012-237875, filed on Oct. 29, 2012, in the Japan Patent Office, the disclosure of which is incorporated herein in its entirety by reference.

TECHNICAL FIELD

The present disclosure relates to a substrate processing apparatus for processing a substrate by using various kinds of processing modules.

BACKGROUND

In a manufacturing process of a semiconductor device, a substrate processing apparatus, which is called as a multi-chamber or a cluster tool, has been used. The multi-chamber or the cluster tool is configured to connect different kinds of processing modules, such as a film formation module for forming films by providing reaction gases to surfaces of semiconductor wafers (hereinafter, referred to as "wafer") or a plasma treatment module for performing a surface treatment on the films formed on the surfaces of the wafers by using the plasma, to a common substrate transfer chamber. In this substrate processing apparatus, different kinds of processes are continuously performed by transferring the wafers to each of the processing modules sequentially.

The processing module for processing the wafers performs its operations based on programs called processing recipes in which processing orders or processing conditions are set. Further, besides the above-mentioned operations with respect to the wafers (hereinafter, referred to as "conditioning operations"), there is a need for other conditioning operations such as a cleaning operation for removing unnecessary films adhered on an interior of a processing container or a leak check operation for checking a vacuum state in the interior of the processing container.

In each of the processing modules, the conditioning operations have different contents, performing timings, or criteria to determine whether or not it is necessary to perform the operations. Further, in the same processing modules, setting conditions for the conditioning operation may be changed based on the processes to be performed with respect to the wafer. As a result, in order to freely change the setting conditions for the conditioning operations in the substrate processing apparatus having various kinds of the processing modules, a combination of items required to change the setting conditions may become substantial. Meanwhile, a method, which flexibly and easily sets the conditioning operations based on requests of each of the processing modules, is not suggested For example, there is known a technology for performing a gas cleaning on a film formation chamber in which a film formation is performed in predetermined lot numbers. Further, there is also known a method of cleaning a substrate processing apparatus which is configured to change cleaning contents or performing timing based on process types. Herein, the performing timing in said method corresponds to the foregoing criteria to determine whether or not it is necessary to perform or the predetermined lot numbers in said technology. However, in the substrate processing apparatus having a plurality of processing modules, there is not known a specific method of setting different conditioning operations at each of the processing modules.

SUMMARY

Various embodiments of the present disclosure provide a substrate processing apparatus which can flexibly and easily set other operations except for operations set in a processing recipe.

According to the present disclosure, there is provided a substrate processing apparatus which ejects a substrate from a transfer container carried-into a carry-in port, transfers the substrate to a processing module, and then processes the substrates. The substrate processing apparatus includes: a plurality of processing modules; a transfer mechanism; a controller; and a setting unit. The processing module is configured to process with respect to the substrate. The transfer mechanism is configured to transfer the substrate ejected from the transfer container. The controller is configured to output control signals for transferring the substrate to the plurality of processing modules along a previously set transfer path through the transfer mechanism sequentially, and for processing with respect to the substrate in the processing module of a transfer destination based on a processing recipe in which a processing order and a processing condition are set. The setting unit is configured to set a content of a non-recipe operation except for operations set in the processing recipe and a performing timing for performing the non-recipe operation by a control operation of the controller every processing module. The non-recipe operation is performed with respect to the processing modules. The performing timing is a timing selected from when the transfer container is carried-into the carry-in port to when a processed substrate is delivered to the transfer container and then the transfer container is carried-out from the carry-in port.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is an explanatory view showing a configuration of a system recipe for controlling the substrate processing apparatus.

FIG. 4 is an explanatory view showing one example of a maintenance macro which is set in a conditioning recipe within the system recipe.

FIG. 5 is an explanatory view showing another example of the maintenance macro.

FIG. 6 is a conditioning table showing setting contents of the conditioning recipe.

FIG. 10 is a third explanatory view showing a setting screen of the conditioning table.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
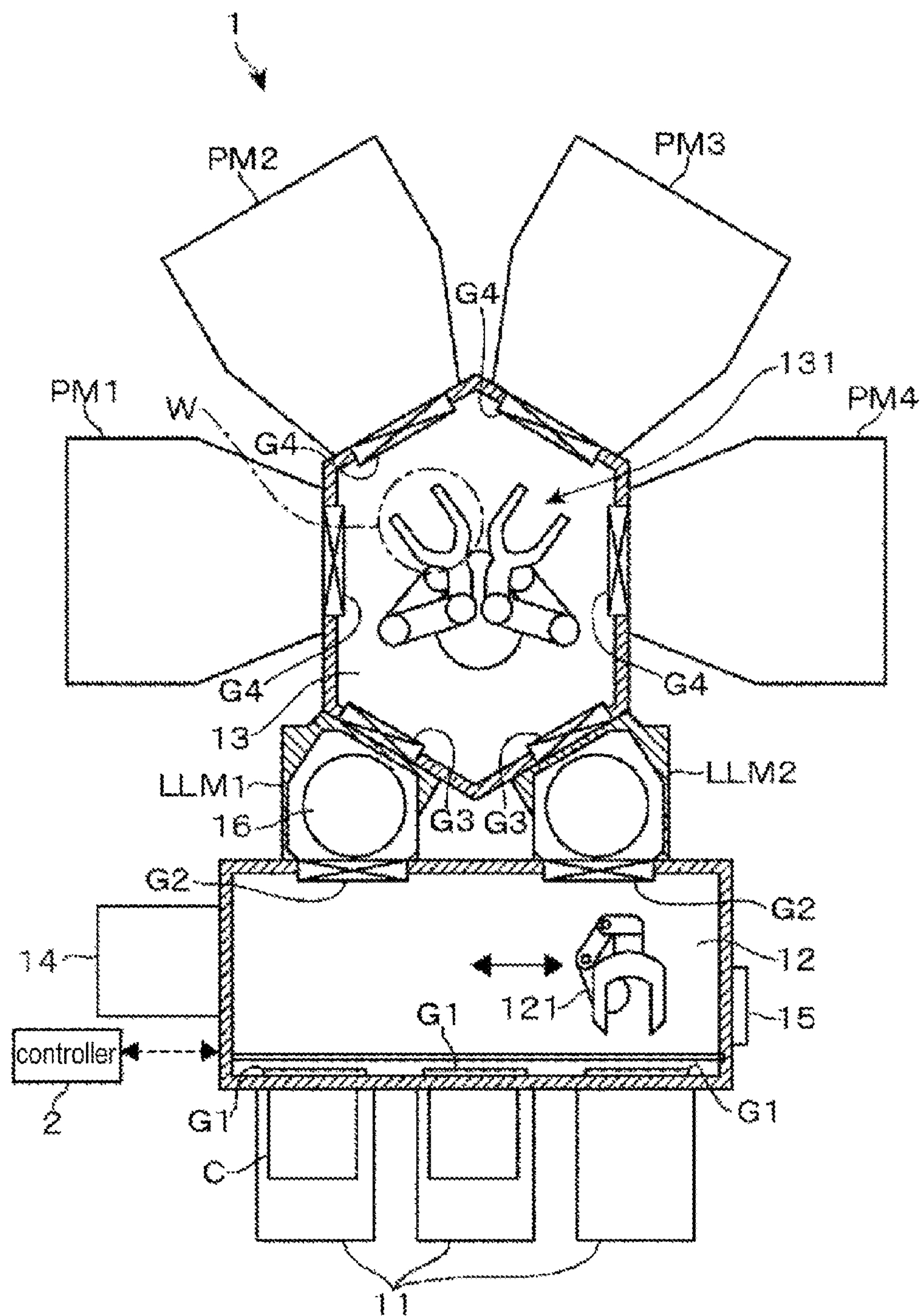
FIG. 1 is a top view showing a substrate processing apparatus according to the present disclosure.

Descriptions will be made as to embodiments of a substrate processing apparatus 1 including processing modules PM1-PM4 which form a Ti film or a TiN film on wafers W and perform plasma treatment on these films. As shown in FIG. 1, the substrate processing apparatus 1 includes carrier mounting tables 11, an atmospheric transfer chamber 12, load lock modules LLM1 and LLM2, a vacuum transfer chamber 13, and processing modules PM1-PM4. On the carrier mounting tables 11, carriers C accommodating predetermined sheets of wafers W to be processed are mounted, and the atmospheric transfer chamber 12 is configured to transfer the wafers W ejected from the carriers C under an air atmosphere. The load lock modules LLM1 and LLM2 are configured to stall the wafers W by switching an internal atmosphere between the air atmosphere and a pre-vacuum atmosphere. The vacuum transfer chamber 13 is configured to transfer the wafers W under the vacuum atmosphere, and the processing modules PM1-PM4 are configured to perform predetermined treatments on the wafers W. These devices are disposed in an order of the atmospheric transfer chamber 12, the load lock modules LLM1 and LLM2, the vacuum transfer chamber 13, and the processing modules PM1-PM4 with respect to a carry-in direction of the wafers W. Adjacent devices are air-tightly connected to each other through doors G1, door valves G2, and gate valves G3 and G4. The carrier mounting table 11 serves as a carry-in port of the carrier C in the present embodiment.

A transfer arm 121, which ejects and transfers the wafers W from the carrier C one by one, is installed in an interior of the atmospheric transfer chamber 12. The transfer arm 121 is installed to be rotatable, expandable, and movable vertically and horizontally. An alignment chamber 14 having an orientor for aligning a position of the wafers W is installed at a side wall of the atmospheric transfer chamber 12.

When viewed from the carrier mounting table 11, two load lock modules LLM1 and LLM2 are installed at the left side and the right side to connect the atmospheric transfer chamber 12 and the vacuum transfer chamber 13. A mounting table 16 on which the carried-in wafers W are mounted is installed in each of the load lock modules LLM1 and LLM2. A vacuum pump (not shown) or a leak valve (not shown) for switching between the air atmosphere and the vacuum atmosphere of the respective load lock modules LLM1 and LLM2, is connected to the each of the load lock modules LLM1 and LLM2.

The vacuum transfer chamber 13 is formed such that its top view has, for example, a hexagonal shape. An interior of the vacuum chamber 13 is under the vacuum atmosphere. The load lock modules LLM1 and LLM2 are connected to two front sides of the vacuum transfer chamber 13. The processing modules PM1-PM4 are connected to other four sides of the vacuum transfer chamber 13. A transfer arm 131 for transfer of the wafers W between the load lock modules LLM1 and LLM2 and each of the processing modules PM1-PM4 is installed in the vacuum transfer chamber 13. The transfer arm 131 is installed to be rotatable and expandable. The vacuum transfer chamber 13 is connected to the vacuum pump (not shown) for maintaining the interior thereof under the vacuum atmosphere.

Each of the transfer arms 121 and 131 servers as a transfer mechanism in the present embodiment. Each of transfer modules are constituted by the transfer arm 121 and the atmospheric transfer chamber 12, the transfer arm 131 and the vacuum transfer chamber 13. In the present embodiment, the transfer modules are constituted with respect to each of the load lock modules LLM1 and LLM2 which connects between two transfer modules.

The processing modules PM1-PM4 are configured to perform different kinds of treatments on the wafers W. In the present embodiment, the processing modules PM1 and PM2 serve as film formation modules, which are configured to form a thin film by providing reaction gas to surfaces of the wafers W disposed in an interior of a processing container under the vacuum atmosphere. The processing modules PM1 and PM2 may be configured to form different kinds of the thin films from each other. For example, the processing module PM1 may be configured to form the Ti film, while the processing module PM2 may be configured to form the TiN film.

Meanwhile, the processing modules PM3 and PM4 include a high frequency antenna installed at a ceiling portion of the processing container. The processing modules PM3 and PM4 serve as a plasma treatment module, which is configured to perform a plasma treatment on the thin film formed on the surfaces of the wafers W by generating plasma with process gas supplied to in the interior of the processing container under the vacuum atmosphere. Further, the foregoing processing modules PM1-PM4 are merely an example for explaining the embodiment of the present disclosure. Thus, in the substrate processing apparatus 1 according to the present disclosure, the numbers, the kinds of the processing modules and the combination thereof are not limited thereto. For example, although the film formation module or the plasma treatment module are disclosed to be in the substrate processing apparatus 1 according to the present disclosure, an etching module which is configured to etch the thin film formed on the surfaces of the wafers W by an etching gas or a plasma ashing module which is configured to decompose and remove a resist film formed on the surfaces of the wafers W by using the plasma after etching may be installed.

Figure 2:
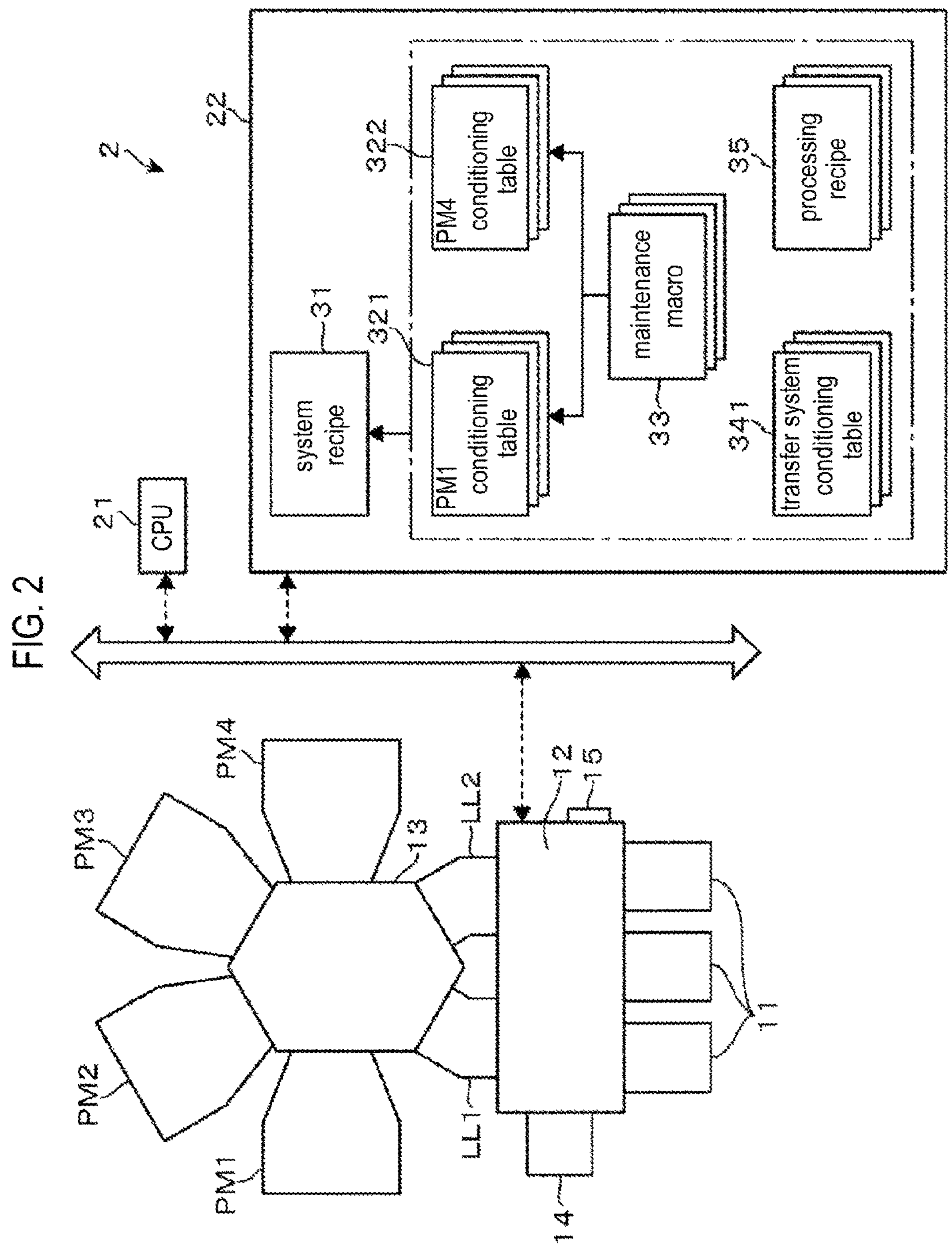
FIG. 2 is a block diagram showing an electric configuration of the substrate processing apparatus.

Further, as shown in FIGS. 1 and 2, a controller 2 is installed in the substrate processing apparatus 1. The controller 2 may be a computer having a central processing unit (CPU) 21 and a storage unit 22. The storage unit 22 stores a program formed with a step (command) group for outputting control signals, which execute the processing operations of the wafers W. The program is stored in a storage medium, for example, a hard disk, a compact disk, a magneto-optical disk, a memory card, etc. The program is installed in the storage unit from the storage medium. Programs or setting values stored in the storage unit 22 may be altered by a touch panel display 15. The touch panel display 15 is installed at a side wall of the atmospheric transfer chamber 12 and constitutes a setting unit according to the present embodiment.

It will be described briefly as to the processing operations of the wafers W by the foregoing substrate processing apparatus 1. While the wafers W accommodated in the carrier C on the carrier mounting table 11 are ejected by the transfer arm 121 and transferred into the interior of the atmospheric transfer chamber 12, a position of the wafers W is determined at the alignment chamber 14, and then the wafers W are delivered to any one of the load lock modules LLM1 and LLM2. Thereafter, when the interiors of the load lock modules LLM1 and LLM2 become under the pre-vacuum atmosphere, the wafers W are ejected by the transfer arm 131 to be transferred into the interior of the vacuum transfer chamber 13. Thereafter, the wafers W are sequentially processed in the interior of the predetermined one of the processing modules PM1-PM4 while being transferred between the vacuum transfer chamber 13 and the processing modules PM1-PM4. The processed wafers W are carried-out along a reverse path (except for the alignment chamber 14) of a carry-in path, thereby being accommodated in the carrier C again.

Herein, the substrate processing apparatus 1 according to the present embodiment has a function for performing the setting of the conditioning operations as described in the background section at each of the processing modules PM1-PM4 and then performing the conditioning operations based on the setting. Hereinafter, the function of the substrate processing apparatus 1 will be described in detail with reference to FIGS. 2 to 14.

As shown in FIG. 2, the storage unit 22 of the controller 2 stores a system recipe 31, which is a program for setting entire operational orders or operational conditions, and a processing recipe 35 including programs or setting values constituting the system recipe 31. Further, conditioning tables 321, 322 and 341, and a maintenance macro 33 are stored in the storage unit 22. Arrows denoted in the storage unit 22 of FIG. 2 indicate reference relationships among these programs or the setting values.

As shown in FIG. 3, the system recipe 31 includes a "transfer path 36" defining transfer paths of the wafers W, a "processing recipe 35" defining operational contents for processing to be performed on the wafers W in the respective processing modules PM1-PM4, a "PM conditioning recipe 32" defining conditioning operations in the respective processing modules PM1-PM4, and a "transfer system conditioning recipe 34" defining the conditioning operations in a transfer system of the wafers W.

Figure 7:
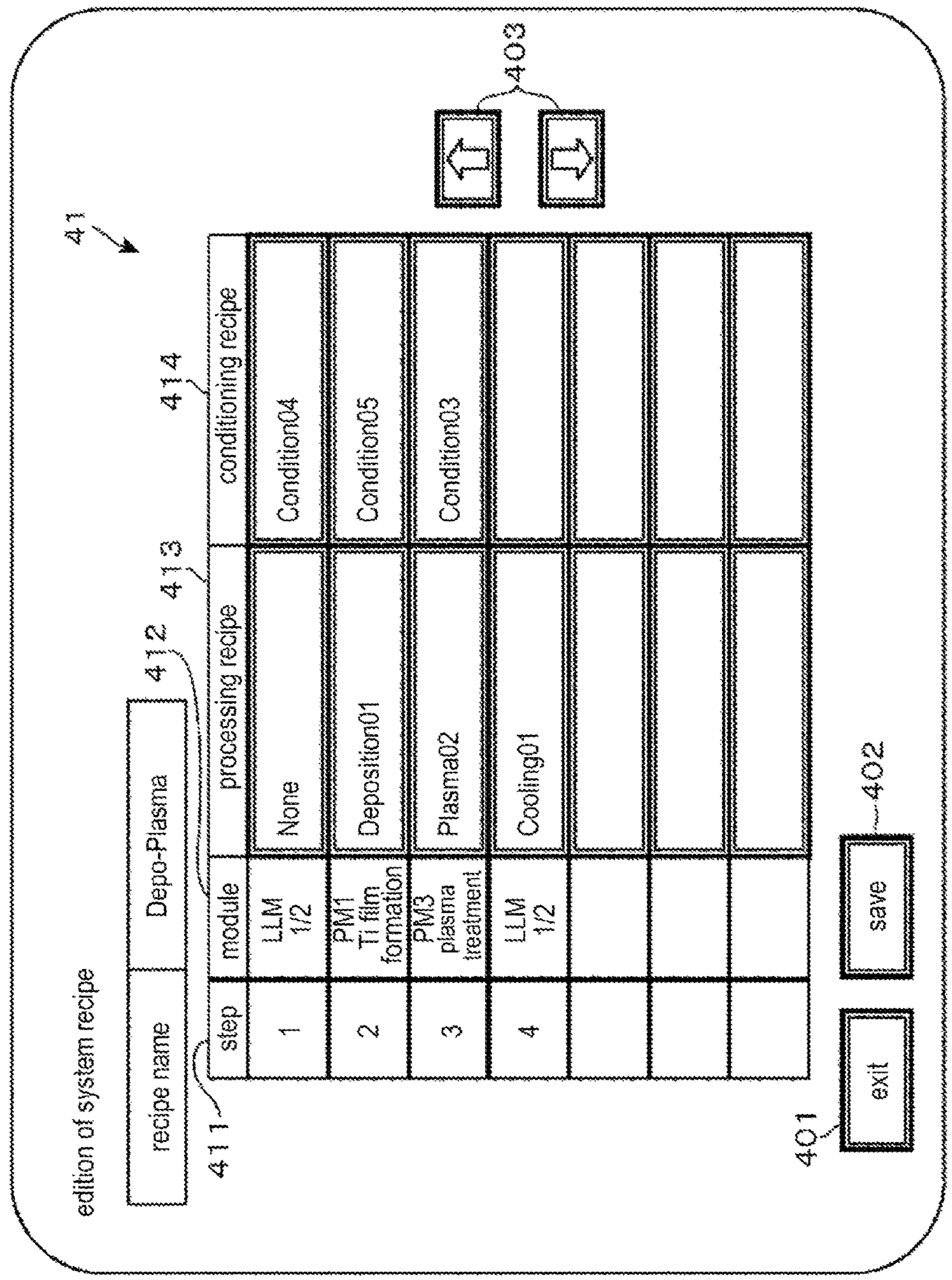
FIG. 7 is an explanatory view showing a setting screen of the system recipe.

The transfer path 36 indicates path information along which the wafers W are transferred within the substrate processing apparatus 1. The transfer path 36 includes information about transfer steps and destination modules (i.e., the load lock modules LLM1 and LLM2 and the processing modules PM1-PM4) to which the wafers W are transferred for each of the transfer steps. FIG. 7 shows one example of an edit screen of the system recipe 31 which is displayed in the touch panel display 15. The transfer steps are indicated in a step column 411 of a system recipe edit area 41. The modules of the transfer destination are indicated in a module column 412.

Referring to FIG. 7, the system recipe 31 having a recipe name of "Depo-Plasma" is set to transfer the wafers W in order of the transfer steps 1 to 4. For example, the wafers W are initially transferred to the load lock module (LLM1 or LLM2), and then transferred to the processing module (PM1). Thereafter, the wafers W are transferred to the processing module (PM3), and finally transferred to the load lock module (LLM1 or LLM2). The transfer path 36 is previously set through another transfer path setting screen (not shown). Further, the transfer path 36 may be configured such that it makes the module column 412 set buttons corresponding to respective steps and the module of the transfer destination of the respective steps is selected by selecting the button. Further, an exit button 401 shown in FIG. 7 is configured to exit an edition of currently displayed screen. A save button 402 is configured to save a result of the edition. Further, up and down buttons 403 are used to scroll the system recipe edit area 41.

Next, as shown in FIG. 3, processing conditions, such as a pressure in the interior of the processing container at the respective processing modules PM1-PM4, a flow rate of the process gas (e.g., reaction gas or processing gas), and a process time, or a processing order, are set in the processing recipe 35. After the wafers W are carried-in, the respective processing modules PM1-PM4 performs the operations based on the setting of the processing recipe 35. By doing so, the wafers W are processed.

The respective processing recipes 35 can be previously set by another processing recipe setting screen (not shown) or previously prepared by the outside computer to thereby be saved in the storage unit 22. Further, in the substrate processing apparatus 1, the processing recipe 35 may include conditions or orders associated with cooling operations until a temperature of the wafers W becomes lower than a predetermined temperature in the interior of the load lock modules LLM1 and LLM2 under the air atmosphere when the processed wafers W are carried-out.

In the embodiment shown in FIG. 7, when a column corresponding to the number of the transfer step in the system recipe edit area 41 is selected from a processing recipe column 413, a processing recipe selection window (not shown) is displayed. The processing recipe 35 of the modules of the transfer destination (e.g., the processing modules PM1-PM4 and the load lock modules LLM1 and LLM2) of the wafers W can be selected through the processing recipe selection window. As a result, the recipe name of the selected processing recipe 35 is displayed in the respective columns of the system recipe edit area 41 in the order of the transfer steps of the wafers W.

In the system recipe edit area 41 shown in FIG. 7, "Deposition01" selected with regard to the processing module PM1 is the processing recipe 35 for forming the Ti film on the surfaces of the wafers W. "Plasma02" selected with regard to the processing module PM3 is the processing recipe 35 for performing the plasma treatment with respect to the thin film on the surfaces of the wafers W. Further, "Cooling01" selected with regard to the load lock modules LLM1 and LLM2 is the processing recipe 35 for cooling the processed wafers W at the predetermined temperature.

According to the processing recipes 35 selected in the system recipe edit area 41 shown in FIG. 7, the wafers W are subjected to the Ti film formation thereon in the processing module PM1 and then to the plasma treatment on the Ti film in the processing module PM3. Thereafter, the wafers W are cooled in the load lock modules LLM1 and LLM2 to thereby be transferred to the carrier C.

In the substrate processing apparatus 1 according to the present embodiment, it is possible to set the conditioning operations except for operations set in the foregoing processing recipe 35 (referred to as non-recipe operations) independently from the processing recipe 35. As shown in FIG. 3, performing orders or the operational conditions for performing the conditioning operations of the processing modules PM1-PM4 are set in the PM conditioning recipe 32 included in the system recipe 31. Further, the performing orders or the operational conditions for performing the conditioning operations of the transfer arms 121 and 131 or the load lock modules LLM1 and LLM2 are set in the transfer system conditioning recipe 34.

FIG. 3 illustrates more detailed contents of the performing orders or the operational conditions set in the PM conditioning recipe 32. The PM conditioning recipe 32 includes a "performing timing" for defining a timing at which the conditioning operation is performed and "performing contents" for defining contents of the conditioning operations which are performed at the performing timing. The performing contents include "performing conditions" for defining criteria to determine whether or not it is necessary to perform the conditioning operations (i.e., conditions for starting the conditioning operations). Further, the performing contents include a "performing period" for defining an interval determining the necessity for conditioning operations, and a "maintenance macro" for defining detailed contents of the operations which are carried out by the conditioning operation.

The performing timing according to the present embodiment is selected from six timings of "prologue", "before carry-in", "after carry-in", "before carry-out", "after carry-out," and "epilogue." The six timing are divided during a time interval measured from a time that the carrier C is carried-into the carrier mounting table 11 to a time that the processed wafers W are delivered to the carrier C and then the carrier C is carried-out from the carrier mounting table 11. The conditioning operations can be performed at the respective timings. "Prologue" is a setting value for performing the conditioning operations at a starting time of a lot. "Epilogue" is a setting value for performing the conditioning operations at an ending time of the lot.

Further, "before carry-in" is a setting value for performing the conditioning operations before the wafers W are carried-into the processing modules PM1-PM4. "After carry-in" is setting value for performing the conditioning operations after the wafers W are carried-into the processing modules PM1-PM4. "Before carry-out" is setting value for performing the conditioning operations before the processed wafers W are carried-out from the processing modules PM1-PM4. "After carry-out" is a setting value performing the conditioning operations after the processed wafers W are carried-out from the processing modules PM1-PM4.

Next, the "performing conditions" in the "performing contents" defines kinds of the conditioning operations which are performed with respect to the processing modules PM1-PM4 and the criteria to determine whether or not it is necessary to perform the conditioning operations. By way of one example of the conditioning operations, a leak measurement for checking whether or not the interior of the processing container is maintained at an predetermined vacuum atmosphere is performed in the film formation module (i.e., the processing modules PM1 and PM2) performing a film formation treatment and the plasma treatment modules (i.e., the processing modules PM3 and PM4) performing the plasma treatment under the vacuum atmosphere. The leak measurement is performed to check leakage of opening/closing valves by measuring a temporal change of the pressure in the interior of the processing container after the interior of the processing container is vacuum-evacuated and then stopped.

In the present embodiment, the judgment criteria for performing this conditioning operation may include the number of the processed wafers W (the number of sheets) and a duration of an idling time at the respective processing modules PM1-PM4. Herein, the film formation modules (i.e., the processing modules PM1 and PM2) heat the wafers W and use a film formation method which is configured to form thin films by providing the reaction gases to the surface of the wafers W. In this case, severity which the respective processing modules PM1 and PM2 are exposed is greatly different from that of the plasma treatment modules (i.e., the processing modules PM3 and PM4). As such, when the same kinds of the conditioning operations are performed, the criteria to determine whether or not it is necessary to perform may be appropriately determined according to the processing contents of the processing modules PM1-PM4. As a result, predetermined values of the judgment criteria may be varied every processing module PM1-PM4. For example, when the predetermined value is the number of sheets, the leak measurement may be performed every 100 sheets with respect to the film formation modules and every 200 sheets with respect to the plasma treatment modules.

Further, the kinds of the conditioning operations may be varied according to the processing contents. For example, a cleaning operation, which is configured to supply a fluoric cleaning gas to remove films deposited on surfaces of the devices, may be performed in the film formation modules (i.e., the processing modules PM1 and PM2) per a predetermined number of sheets or whenever an accumulated value of a film thickness formed on the wafers W becomes greater than a predetermined value. Meanwhile, for example, a conduction check of an electric power supplier supplying the electric power to the high frequency antenna may be performed in the plasma treatment modules (i.e., the processing modules PM3 and PM4 after the idling time at a start-up.

Besides, it is not essential to prepare the criteria to determine whether or not it is necessary to perform the conditioning operations such as the accumulated value of the film thickness in the "performing conditions". When setting the performing contents, selecting predetermined kinds of the conditioning operations may become conditions for starting the conditioning operations. In the present embodiment, the description has been made as to the film formation module and the plasma treatment module. However, if different kinds of the processing modules are installed, the kinds of the conditioning operations or the criteria to determine whether or not it is necessary to perform the conditioning operations may be appropriately determined according to processing contents.

Figure 11:
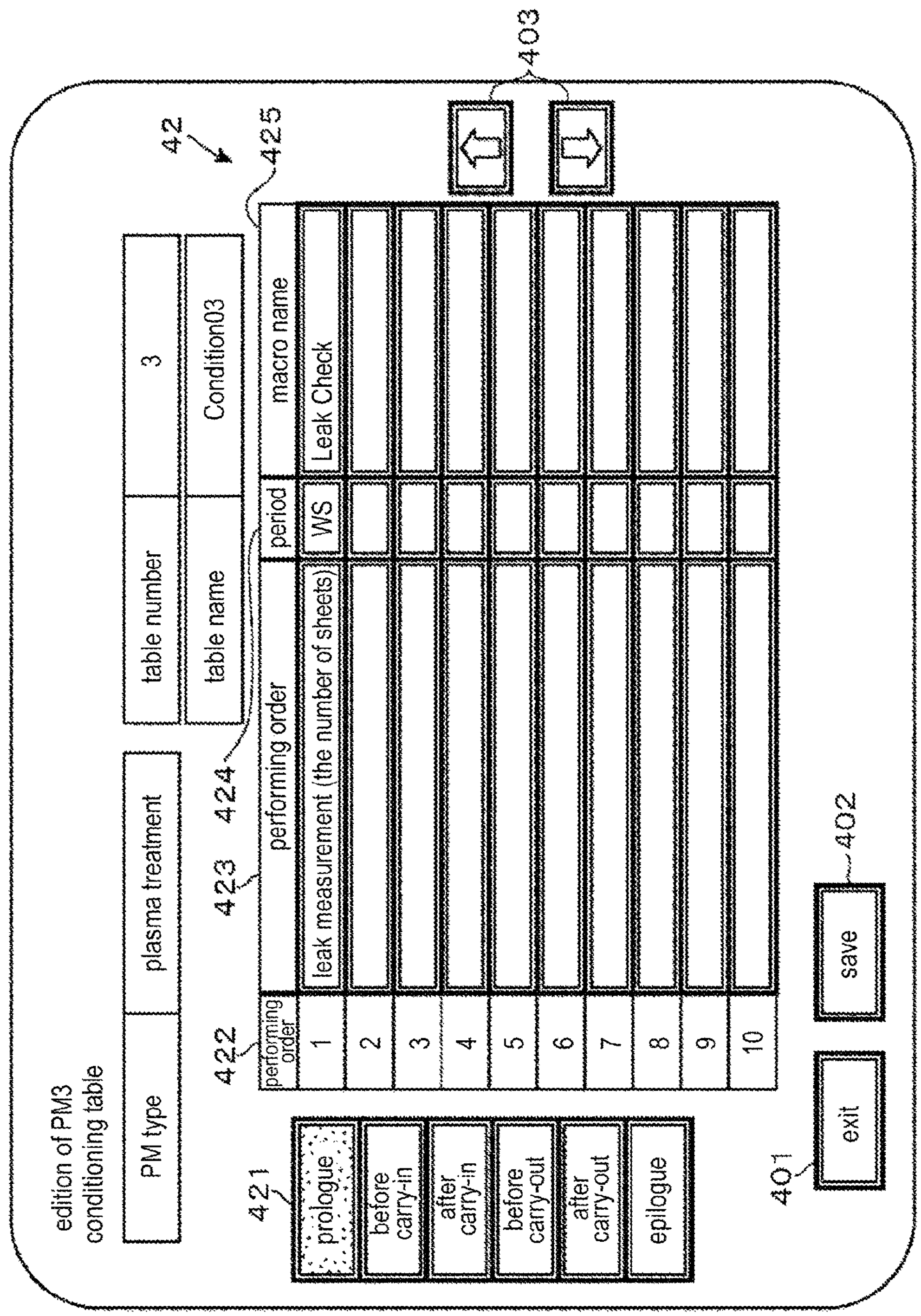
FIG. 11 is a fourth explanatory view showing a setting screen of the conditioning table.

Subsequently, the "performing period" in the "performing contents" defines whether an interval to determine whether it is necessary to perform the conditioning operations is every carrier (indicated by "CA" in FIGS. 3 and 11) or every wafer (indicated by "WS" in FIGS. 3 and 11). For example, when the "film thickness" is determined to the criterion to determine whether or not it is necessary to perform the conditioning operations at the performing timing of "prologue", if "every carrier" is selected, it is determined whether or not the accumulated value of the film thickness becomes larger than a predetermined threshold before the wafers W ejected from the carrier C are initially carried-into the respective processing modules PM1-PM4. Meanwhile, if "every wafer" is selected, it is determined before the respective wafers W are carried-in.

In other words, when "every carrier" is selected, even if the accumulated value of the film thickness becomes larger than the predetermined threshold during processing the wafers W accommodated in an arbitrary carrier C, the judgment about whether or not it is necessary to perform the conditioning operations is not performed during processing the wafers W within the carrier C and then is performed when starting to process next carrier C. Meanwhile, if "every wafer" is selected, said judgment is performed whenever processing the respective wafers W. Thus, while the wafers W within the common carrier C are processed, the conditioning operations are performed at a time that the accumulated value of the film thickness becomes larger than the predetermined threshold.

Further, it is configured such that the conditioning operations are performed every lot at the performing timings of "prologue" and "epilogue." However, the substrate processing apparatus 1 according to the present embodiment may be configured to set the wafers W accommodated in one carrier C to a plurality of lots. For example, in the carrier C accommodating 25 sheets of the wafers W, when the wafers W, which are held by slots of 1 to 10th stages from the upper end, are processed by using the common system recipe, 10 sheets of the wafers W are set to one lot. Further, if a second system recipe is set for 11 to 20th stages and a third system recipe is set for 21 to 25th stages, the carrier C includes three lots.

At this time, when "every carrier" is selected at the performing timing of "prologue", even if the carrier C includes the plurality of lots, it is determined whether or not it is necessary to perform the conditioning operations only when starting to process a first one wafer W within the carrier C (for example, a timing before the wafers W ejected from the carrier C are initially carried-into the respective processing modules PM1-PM4). Meanwhile, when "every wafer" is selected at this performing timing, it is determined whether or not it is necessary to perform the conditioning operations before a first one wafer W of the respective lots within the carrier C are initially carried-into the respective processing modules PM1-PM4.

Finally, the "maintenance macro" in the "performing contents" is a program which defines operational commands, predetermined values, and performing orders of a plurality of commands for the processing modules PM1-PM4 according to the kinds of the conditioning operations selected by "performing conditions."

FIGS. 4 and 5 show exemplary configurations of the maintenance macro for the processing module PM1 performing the Ti film formation. The maintenance macro 33 of the macro name of "Cond/Leak Rate" shown in FIG. 4 is configured to execute three commands of "leak rate", "CM zero point adjustment", and "recipe" in that order.

The command of "leak rate" is a command for measuring the temporal change of the pressure in the interior of the processing container as described above. The command of "CM zero point adjustment" is a command for adjusting a zero point of a pressure gauge. These commands are selected from a command list which is previously prepared according to the kinds of the conditioning operations. These commands may be configured such that input for the settings with regard to the conditioning operations can be received from the user. By way of an example, contents of the settings may include a supplying time of a cleaning gas or the pressure of the processing container. In the maintenance macro 33 shown in FIG. 4, "having selection" of "CM zero point adjustment" means that the pressure gauge, which is subjected to the zero point adjustment, is selected from a plurality of pressure gauges by the user.

Meanwhile, the command of "recipe" is a command which is made by the user. The user can set the contents of the command during the operations of the processing modules PM1-PM4 which can output control signals from the controller 2. For example, the "recipe" shown in FIG. 4 is a command for controlling a temperature of the mounting table on which the wafers W are mounted. A currently executing recipe name is indicated in a field of a setting 1. For example, a program for raising the temperature of the mounting table during the conditioning operation is set in the recipe name of "TempStap."

The recipe is previously set through a recipe setting screen (not shown) of the maintenance macro or prepared by the outside computer to thereby be saved in the storage unit 22. It is possible to be used by reading the recipe prepared by the outside computer from the storage unit 22. For example, in the maintenance macro 33 of the macro name of "Cond/Before", the two recipes of "TempStap" and "Precoat" made by the user are performed in that order. For example, the recipe name of "Precoat" is an operation to deposit a protective Ti film on the surfaces of the devices positioned in the interior of the processing container after cleaning.

The "performing timing" and the "performing contents (e.g., performing conditions, performing period)" as described above are managed per PM conditioning tables 321 and 322. As shown in FIG. 6, the PM conditioning tables 321 and 322 are tables in which the performing contents are arranged correspondingly to the performing timing. The conditioning operations, which are determined as the performing contents, are performed in an order of the performing timing set in the PM conditioning tables 32 and 322 (i.e., prologue→conditioning before carry-in→ . . . →epilogue). Further, in the respective performing timings, it is possible to set a plurality of performing contents. These performing contents are performed in a predetermined performing order (indicated by "No. 1-No. 10" in FIG. 6). As shown in FIG. 2, the PM conditioning tables 321 and 322 can be multiple and be made for every processing module PM1-PM4. The PM conditioning recipe in the system recipe 31 is set with reference to the PM conditioning tables 321 and 322 selected from them.

Figure 8:
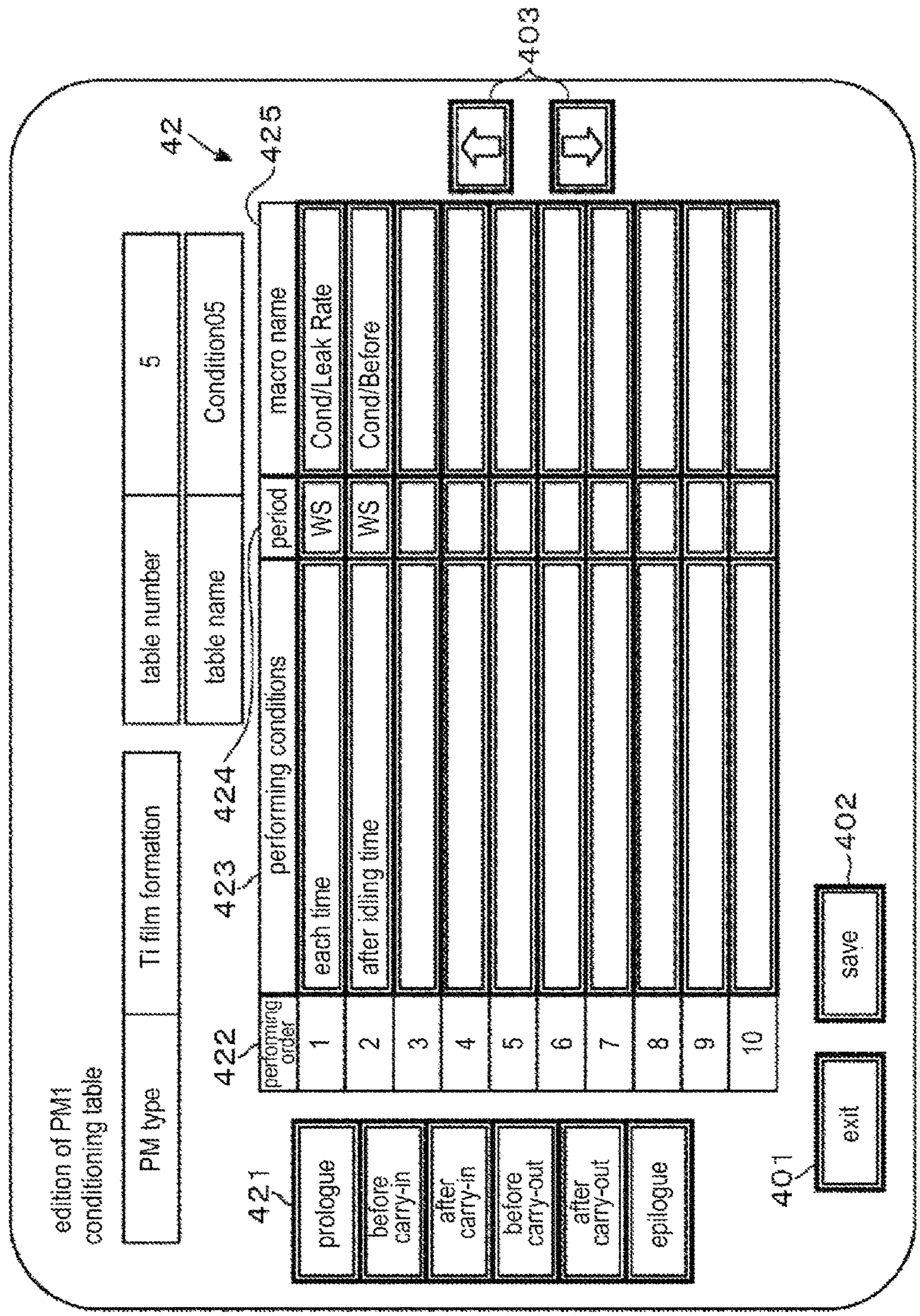
FIG. 8 is a first explanatory view showing a setting screen of the conditioning table.

Next, descriptions will be made as to a method of editing the PM conditioning tables 321 and 322 through the touch panel display 15 with reference to FIGS. 8 to 13. FIG. 8 shows one example of an edit screen of the conditioning table of the processing module PM1 performing the Ti film formation. A performing timing selection button 421 and a conditioning table edit area 42 are indicated in this edit screen. The performing selection button 421 includes six buttons corresponding to the performing timings. If the respective buttons are selected, the conditioning table edit area 42 is switched to be displayed. The setting of the performing contents of the currently performing conditioning operations at that performing timing is reflected.

The performing order of the respective performing contents is indicated in a performing order column 422 in the conditioning table edit area 42. The performing contents (i.e., the performing conditions, the performing period, and the maintenance macro) are indicated in a performing condition column 423, a performing period column 424, and a macro name column 425, respectively.

Figure 9:
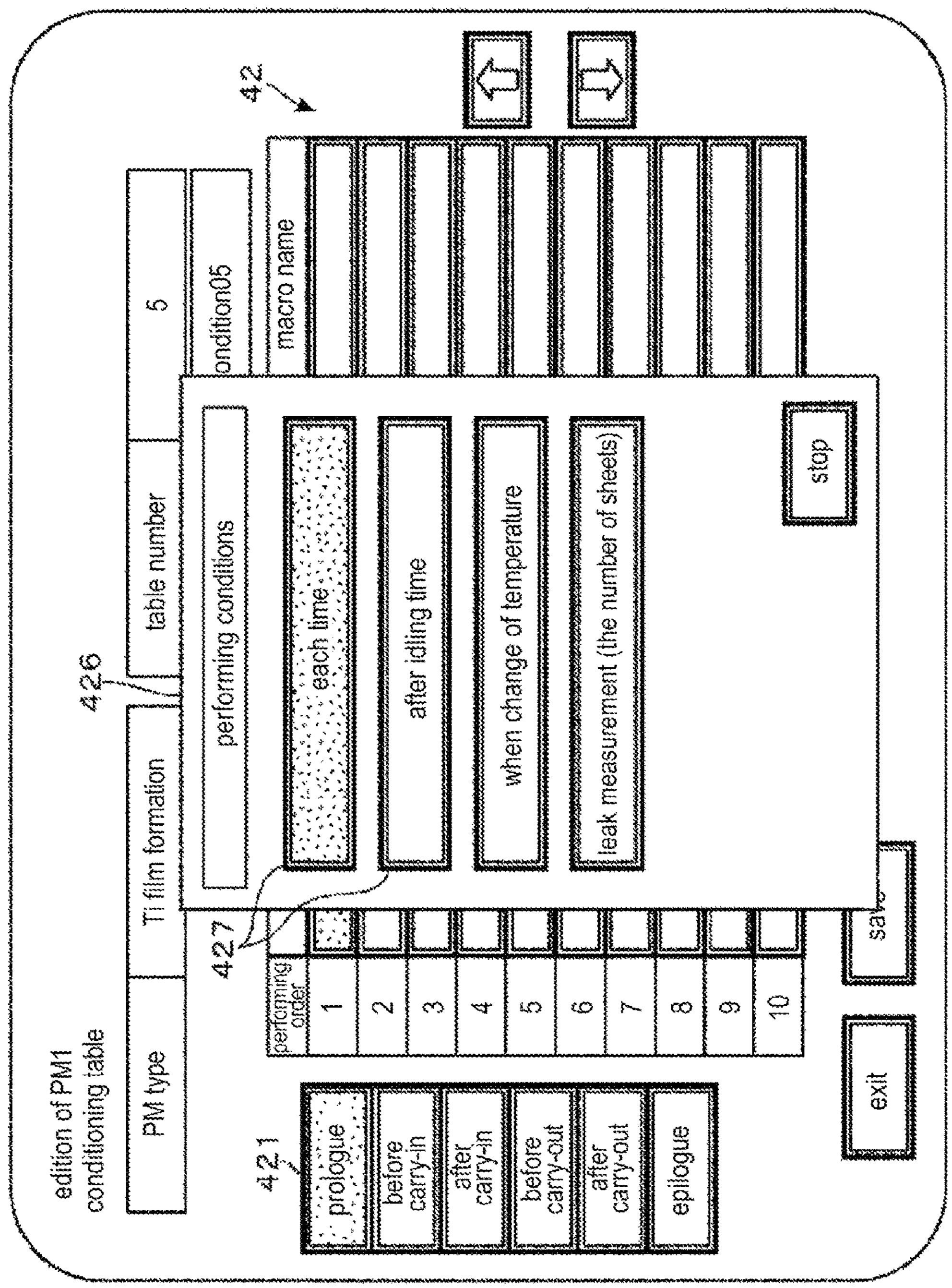
FIG. 9 is a second explanatory view showing a setting screen of the conditioning table.

For example, when the performing condition column 423 is selected in a state that the performing timing selection button 421 of "prologue" is selected, a performing condition selection window 426 is opened as shown in FIG. 9. Performing condition selection buttons 427 are indicated in the performing condition selection window 426. The performing conditions are selected from the performing condition selection buttons 427. As such, it is possible to select the kinds of the conditioning operations which can be performed and the criterion to determine whether it is necessary to perform the conditioning operations at the prologue of the processing module PM1 for the Ti film formation (see FIG. 9). Further, a highlight mark, which is indicated with hatching in the drawings, is to indicate that the buttons 421 and 427 or the columns are selected.

As shown in FIG. 10, the contents of the performing condition selection button 427 indicated in the performing condition selection window 426 are changed according to the performing timing selection button 421 to be selected. As such, it is possible to prevent a wrong selection of the kinds of the conditioning operations which can be performed or the criterion to determine whether it is necessary to perform the conditioning operations at the respective performing timings.

Next, the performing periods of "every carrier" and "every wafer" are selected through a performing period selection window (not shown) by selecting the performing period column 424. The maintenance macro 33 is selected through a maintenance macro selection window (not shown) by selecting the macro name column 425. At this time, the only maintenance macro 33, which can be selected correspondingly to the performing conditions selected from the performing conditions column 423, may be indicated in the maintenance macro selection window. Further, for example, when the maintenance macro 33 including the recipe made by the user is used, a creation command of the performing condition selection button 427 may be set together with the maintenance macro 33. The performing conditions, which are appropriate to execute the maintenance macro 33, may be indicated in the performing condition selection window 426.

Herein, in edit screens of the conditioning tables shown in FIGS. 8 to 14, the up and down buttons 403 sever to rearrange the performing order of the performing contents indicated in the conditioning table edit area 42. For example, in FIG. 8, if a lower arrow of the up and down buttons 403 is selected after "each time" corresponding to the performing order 1 is selected, the performing contents in every row are moved downward (with a set of the performing conditions, the performing period, and the macro name). As a result, the performing contents can be rearranged such that the performing order 1 becomes "after idling time" and the performing order 2 becomes "each time."

Figure 12:
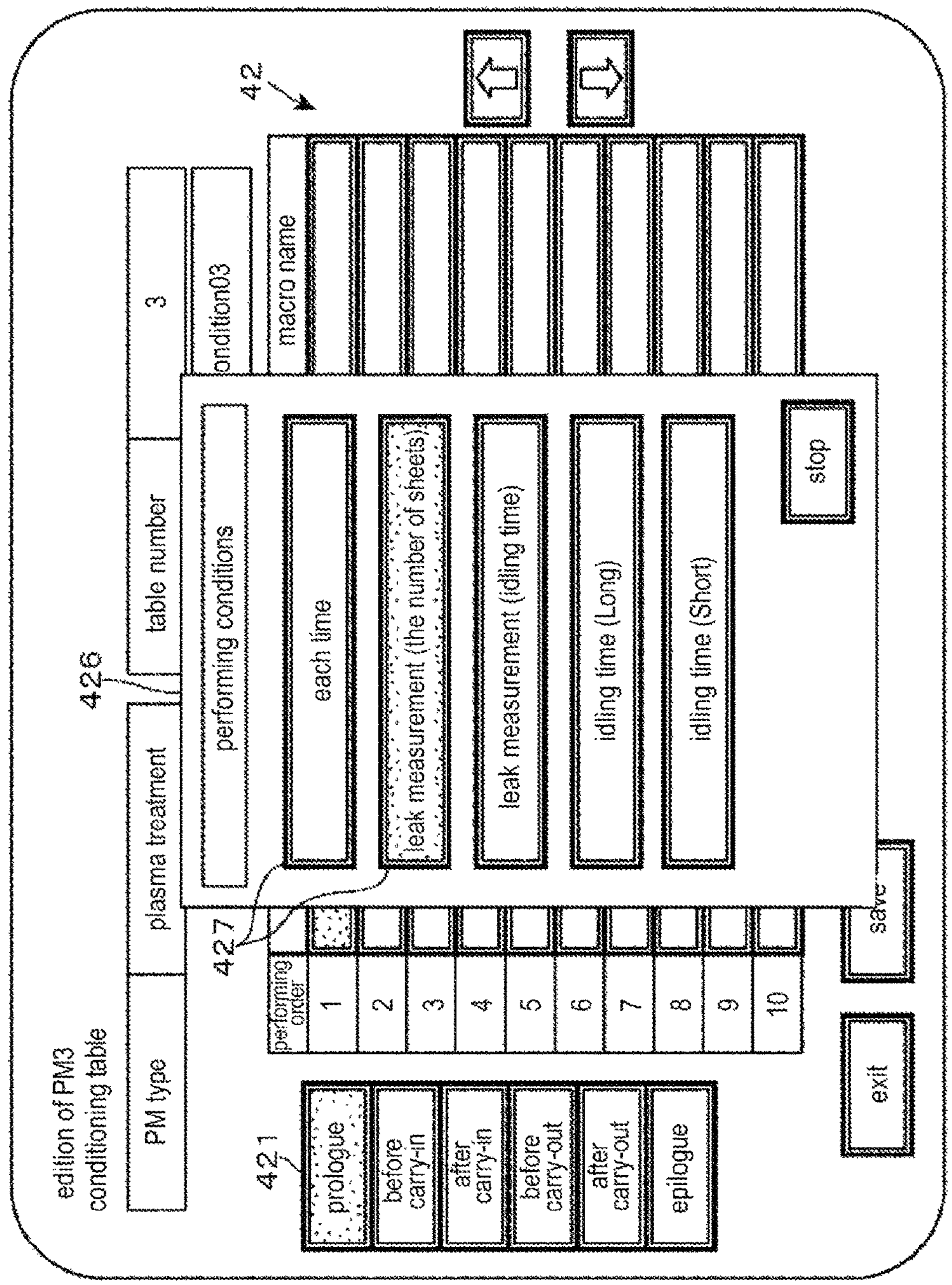
FIG. 12 is a fifth explanatory view showing a setting screen of the conditioning table.
Figure 13:
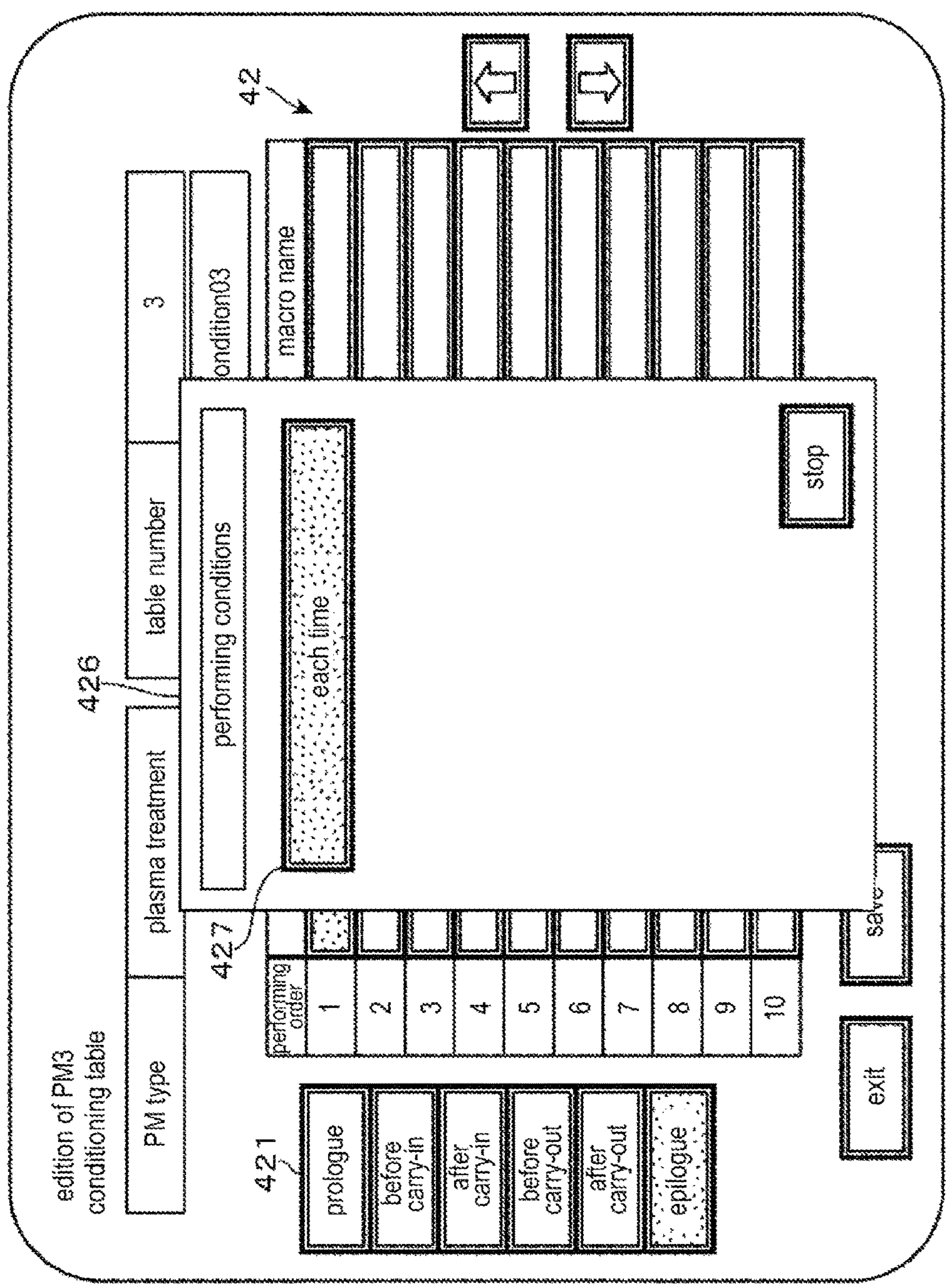
FIG. 13 is a sixth explanatory view showing a setting screen of the conditioning table.

The performing contents or the performing orders of the conditioning operations are set every timing that required performing conditioning operations by the foregoing selection. Edit screens of the conditioning table are installed in each of the processing modules PM1-PM4. For example, FIGS. 11 to 13 illustrate edit screens of the conditioning tables of the plasma treatment module (e.g., the processing module PM3). In FIGS. 11 to 13, the same reference numerals will be assigned to the same elements as indicated in the edit screens of FIGS. 8 to 10. As shown in FIGS. 12 and 13, performing conditions, which are different from those of the processing module PM1 for performing the Ti film formation, are indicated in the performing condition selection window 426 of the processing module PM3 performing the plasma treatment. As a result, the kinds of the conditioning operations are determined based on types of processes performed at the respective processing modules PM1 and PM3. Herein, the edit screens of the PM conditioning tables 321 and 322, which are displayed through the touch panel display 15, correspond to an input unit according to the present embodiment.

If an edition of the conditioning table is finished at the respective edit screens, a table number or a table name may be set through a conditioning table save window (not shown) by selecting the save button 402. As such, the PM conditioning tables 321 and 322 having the table number or the table number are saved in the storage unit 22 (see FIG. 2). Thereafter, an edition of the PM conditioning tables 321 and 322 is finished by selecting the exit button 401.

Besides, it may be configured to select the PM conditioning tables 321 and 322, which are predetermined. The setting contents of the selected PM conditioning tables 321 and 322 are displayed in the conditioning table edit area 42 to be editable. For example, the edited conditioning table can be saved as new PM conditioning tables 321 and 322 by making a field of the table number serve as a table number button and assigning a new table number through this button. Further, the table number may overwrite the previous PM conditioning tables 321 and 322 without a change thereof.

In the edit screen of the system recipe 31 shown in FIG. 7, if a conditioning recipe column 414 is selected, a selection window (not shown) of the PM conditioning tables 321 and 322, which are previously made, is displayed. In each of the columns, it is possible to select the conditioning recipe corresponding to the processing modules PM1 and PM3 indicated in the module column 412. The PM conditioning recipe is made based on the PM conditioning tables 321 and 322 selected herein. In view of the forgoing, the edit screen of the system recipe 31 displayed in the touch panel display 15 corresponds to a selection unit.

Returning to an explanation of the system recipe 31 shown in FIG. 3, it may perform settings of a conditioning recipe of the transfer system such as the transfer arms 121 and 131 or the load lock modules LLM1 and LLM2 in addition to the PM conditioning tables 321 and 322 of the processing modules PM1-PM4. The transfer system conditioning recipe includes the performing timing and the performing contents. The performing contents include the performing conditions, the performing period, and the maintenance macro similarly to the PM conditioning recipe. However, the transfer system conditioning recipe is different from the PM conditioning recipe in that there are two timings of "prologue" and "epilogue."

Figure 14:
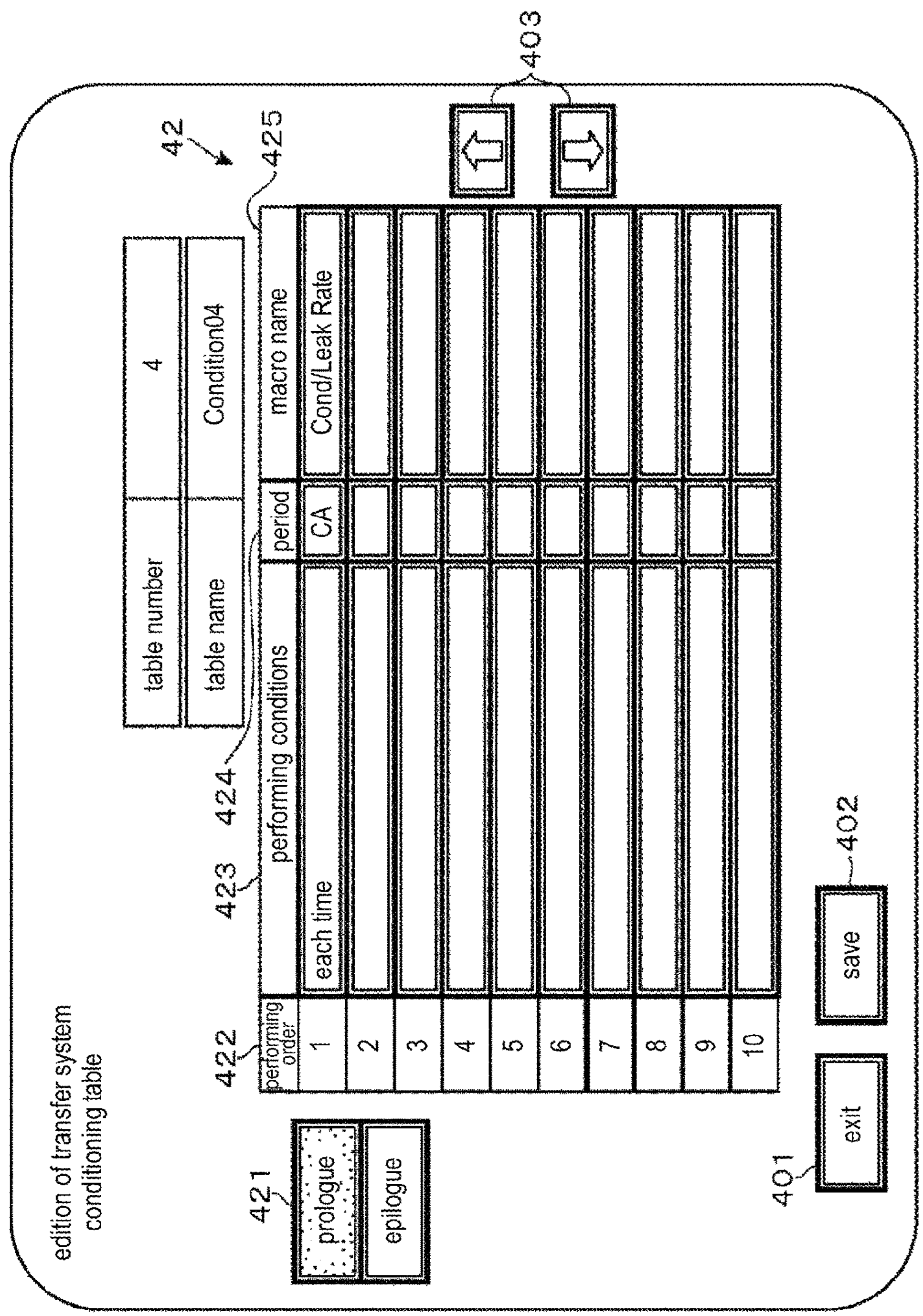
FIG. 14 is a seventh explanatory view showing a setting screen of the conditioning table.

Similarly to the PM conditioning recipe, the transfer system conditioning table 341 for making the transfer system conditioning recipe is set every performing timing by using a conditioning table edit screen (see FIG. 14). Further, the transfer system conditioning table 341 (see FIG. 2) saved in the storage unit 22 is selected from the conditioning table column 414 of the edit screen of the system recipe 31. An edit screen of the transfer system conditioning table 341 also corresponds to the input unit according to the present embodiment. By way of an example, conditioning operations of the transfer system may include a leak check operation of the load lock modules LLM1 and LLM2 and a warming operation. The warming operation is configured to raise a temperature of surfaces of the transfer arms 121 and 131 by operating the transfer arms 121 and 131 without holding the wafers W before starting the process in order to prevent deposition of reaction products caused by the reaction gases on surfaces of the transfer arms 121 and 131.

By doing so, if an edition of the system recipe 31 is finished through the edit screen, the system recipe 31 is saved by the save button 402 and then the edit screen is closed by the exit button 401. Further, the wafers W are processed and the conditioning operations are performed by selecting the system recipe 31 to be performed with respect to the wafers W within the carrier C every lot through a selection window (not shown) of the system recipe 31.

Figure 15:
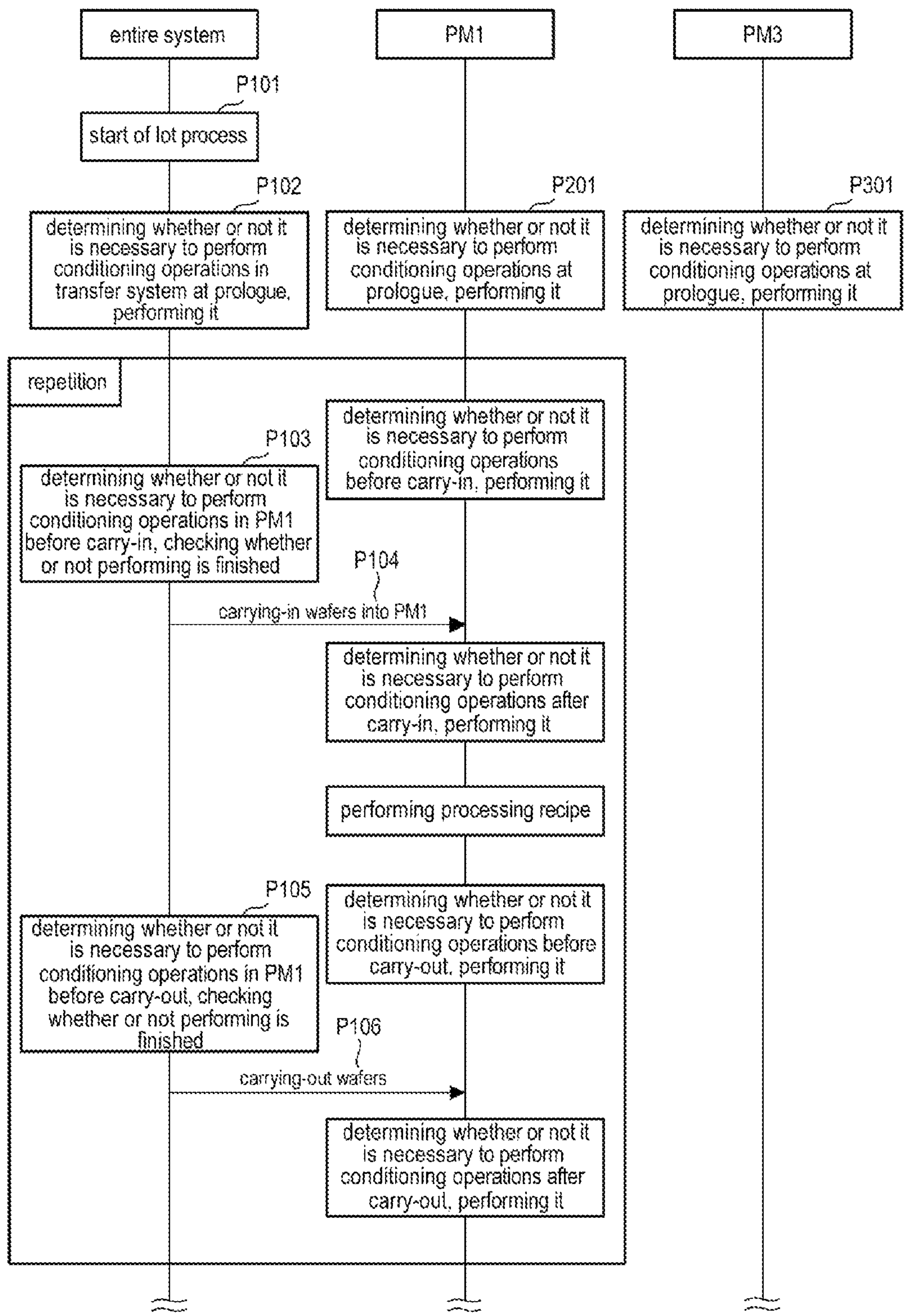
FIG. 15 is a first explanatory view showing a process flow of the substrate processing apparatus.

Hereinafter, descriptions will be made as to processes to be performed in the entire system of the substrate processing apparatus 1 and the processing modules PM1-PM4 with reference to sequence diagrams shown in FIGS. 15 and 16. Firstly, when starting a lot process (P101 shown in FIG. 15), it is determined whether or not it is necessary to perform the conditioning operations with respect to the transfer system (e.g., the transfer arms 121 and 131 and the load lock modules LLM1 and LLM2) and the processing modules PM1 and PM3 at the processing timing of "prologue." If it is necessary to perform, then the conditioning operations are performed based on the settings of the conditioning recipe (P102, P201 and P301).

Subsequently, in the processing module PM1 in which the wafers W are carried firstly, it is determined whether or not it is necessary to perform the conditioning operations at the processing timing of "before carry-in." If it is necessary, then the conditioning operations are performed (P202). The system determines whether or not it is necessary to perform the conditioning operations in the processing module PM1 of the transfer destination before carry-in. If it is necessary, then the wafers W are carried-into the processing module PM1 after checking whether or not the conditioning operation has been finished (P103 and P104).

When the wafers W are carried-in, it is determined whether or not it is necessary to perform the conditioning operations in the processing module PM1 at the performing timing of "after carry-in." If it is necessary, then the conditioning operations are performed (P203). Subsequently, the Ti film formation treatment is performed on the wafers W based on the processing recipe 35 (P204). When this treatment is finished, it is determined whether or not it is necessary to perform the conditioning operations at the performing timing of "before carry-out." If it is necessary, then the conditioning operations are performed (P205).

The system determines whether or not it is necessary to perform the conditioning operations in the processing module PM1 in which the treatment has been finished before carry-out. If it is necessary, the wafers W are carried-out from the processing module PM1 after checking whether or not the conditioning operation has been finished (P105 and P106). Meanwhile, the processing module PM1 determines whether or not it is necessary to perform the conditioning operations at the performing timing of "before carry-out." If it is necessary, then the conditioning operations are performed (P206). The system and the processing module PM1 repeats the processes of P103 to P106 and P202 to P206 while measuring the timing of carry-in and carry-out of the wafers W between the processing module PM1 and the processing module PM3 in the next step.

Figure 16:
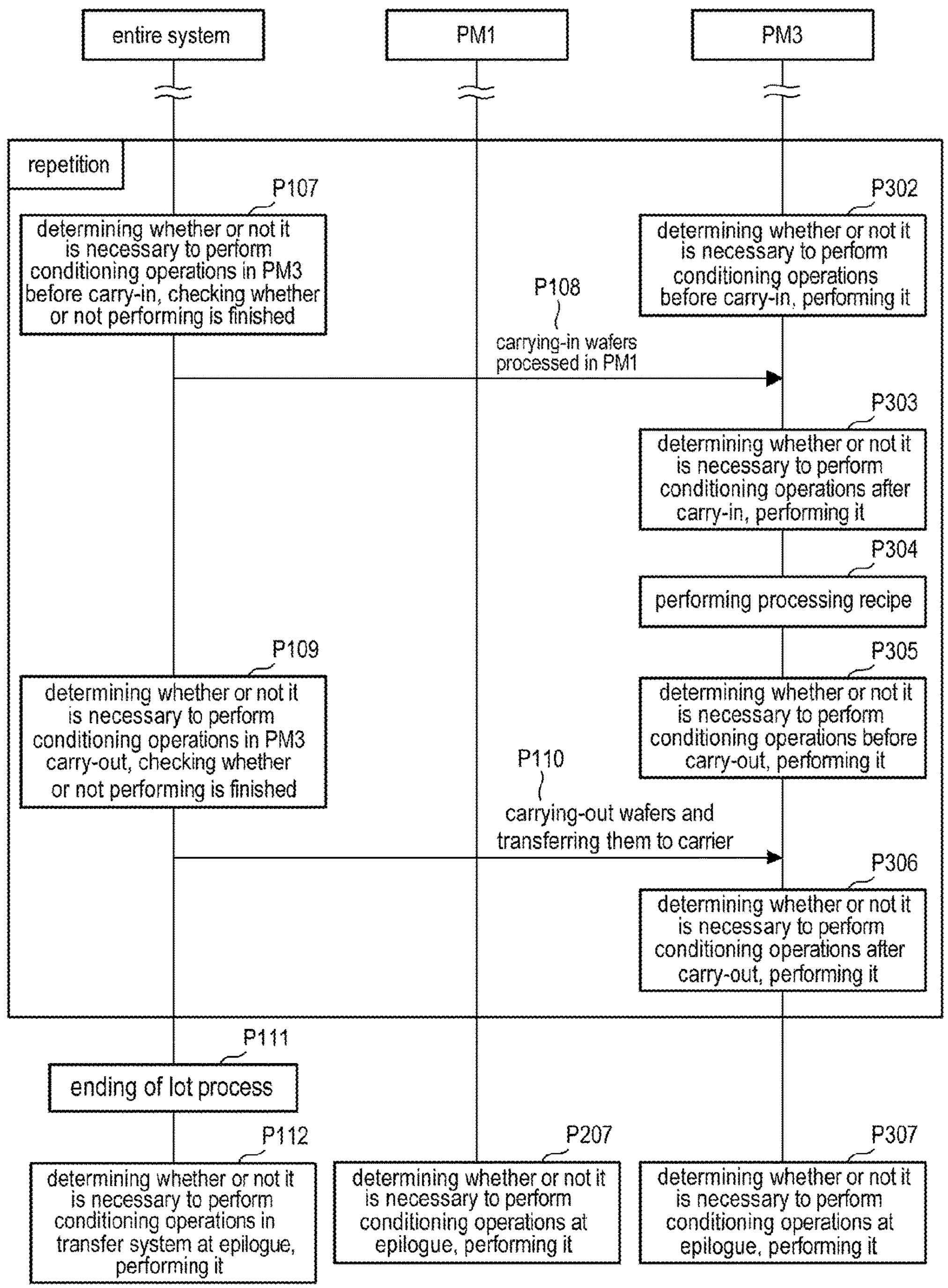
FIG. 16 is a second explanatory view showing a process flow of the substrate processing apparatus.

Meanwhile, it is determined whether or not it is necessary to perform the conditioning operations in the processing module PM3 for performing the plasma treatment at the performing timing of "before carry-in." If it is necessary, then the conditioning operations are performed (P302 shown in FIG. 16). The system determines whether or not it is necessary to perform the conditioning operations in the processing module PM3 of the transfer destination before carry-in. If it is necessary, then the wafers W, which have been processed in the processing module PM1, are carried-into the processing module PM3 after checking whether or not the conditioning operation has been performed (P107 and P108).

When the wafers W carried-in, the processing module PM3 determines whether or not it is necessary to perform the conditioning operations at the performing timing of "after carry-in." If it is necessary, then the conditioning operations are performed (P303). Subsequently, the plasma treatment is performed on the Ti film based on the setting of the processing recipe 35. When this treatment is finished, it is determined whether or not it is necessary to perform the conditioning operations at the performing timing of "before carry-out." If it is necessary, then the conditioning operations are performed (P305).

The system determines whether or not it is necessary to perform the conditioning operations in the processing module PM3 in which the treatment has been finished before carry-out. If it is necessary, then the wafers W are carried-out from the processing module PM3 to be transferred to the carrier C after the conditioning operations have been finished (P109 and P110). Meanwhile, the processing module PM3 determines whether or not it is necessary to perform the conditioning operations at the performing timing of "after carry-out." If it is necessary, then the conditioning operations are performed (P306). The system and the processing module PM3 repeats the processes of P107 to P110 and P302 to P306 while measuring the timings of carry-in and carry-out of the wafers W between the processing module PM1 in the previous step and the processing module PM3.

When the process with respect to the wafers W within the common lot is finished by doing so (P111), it is determined whether or not it is necessary to perform the conditioning operations with respect to the transfer system and the processing modules PM1 and PM3 at the performing timing of "epilogue." If it is necessary, then the conditioning operations are performed based on the setting of the respective conditioning recipes (P112, P207 and P307).

The substrate processing apparatus 1 according to the present embodiment has the following effects. The operations to be performed in the respective processing modules PM1-PM4 are divided into the operations set in the processing recipe and other conditioning operations (i.e., non-recipe operations) such that the performing contents and the performing timing with respect to these conditioning operations are set every processing module PM1-PM4. As a result, it is possible to set the conditioning operations having various contents flexibly and easily.

Further, since the conditioning operations are set with respect to the transfer system, it is possible to set more various conditioning operations. In particular, setting items about the conditioning operations are previously set in the conditioning tables 321, 322 and 341. The system recipe 31 is constituted by combining the conditioning tables 321, 322 and 341 and the processing recipe 35. Accordingly, a making operation of the system recipe 31 can be simplified. Further, it is easy to understand the operational contents set in the system recipe 31.

Herein, the timing for performing the conditioning operations is not limited to the foregoing six timings to be set in the processing modules PM1-PM4 and the foregoing two timings to be set in the transfer system. The performing timings of six kinds of "prologue", "before carry-in", "after carry-out", "before carry-out", "after carry-out", and "epilogue" may be increased or decreased as necessary. Other performing timing of, for example, "when arranging the wafers W within the alignment chamber 14", may be set. Further, the number of the processing modules PM or the load lock modules LLM installed in the substrate processing apparatus 1 is not limited to the embodiment shown in FIG. 1. The number of the modules PM and LLM may be appropriately increased or decreased based on the number of sheets of the wafers W to be processed per unit time.

Further, the transfer mechanism and the processing modules PM of the substrate processing apparatus 1 according to the present disclosure are not limited to the plurality of processing modules PM1-PM4 which are connected to the common vacuum transfer chamber 13 including the transfer arm 131 as shown in FIG. 1. For example, the processing modules may be disposed at the front and the rear of the vacuum transfer chamber in which the transfer arm is installed. Further, the processing modules and the vacuum transfer chamber may be disposed alternately in series such that the wafers W are transferred an order of "processing module→vacuum transfer chamber→processing module→vacuum transfer chamber→ . . . ."

Besides, the film formation module installed in the substrate processing apparatus as the processing modules according to the present disclosure is not limited to the example of forming the Ti film or the TiN film. For example, the film formation module may be configured to form metal films including Ru, Al, Mn, Co, Cu, Zn, Zr, No, Hf, W, etc. and metal compound films such as metal nitride films or metal oxide films. Further, the substrate processing apparatus is not limited to various kinds of the processing modules which perform different kinds of the process, such as the film formation module (i.e., the processing modules PM1 and PM2) and the plasma treatment modules (i.e., the processing modules PM3 and PM4), as shown in FIG. 1. For example, the substrate processing apparatus having the plurality of film formation modules may be configured to perform the conditioning operations in different contents or at different performing timings according to kinds of the films to be formed in the respective film formation modules.

Further, the kinds of the processing modules are not limited to the process under the vacuum atmosphere. For example, the present disclosure may be applied to a heating module for heating the wafers W, a coating module for coating the surfaces of the wafers W with a resist solution, a developing module for coating the surfaces of the wafers W with a developing solution, a cleaning module which supplies a cleaning solution to the front and rear surfaces of the wafers W to perform a cleaning process, etc. under the air atmosphere. In these cases, the transfer mechanism of the wafers W may not be installed in the vacuum transfer chamber. Further, kinds of the substrates to be processed in the substrate processing apparatus according to the present disclosure are not limited to the wafers W. For example, the present disclosure may be applied to a substrate processing apparatus which is configured to process a polygonal substrate to be used for manufacturing a flat panel.

According to the present disclosure, the operations to be performed in the respective processing modules are divided into the operations set in the processing recipe and the non-recipe operations. Since the performing contents and the performing timings with regard to the non-recipe operations are set every processing module, it is possible to set the non-recipe operations of various contents flexibly and easily.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for ejecting a substrate from a transfer container carried-into a carry-in port, transferring the substrate to a processing module, and then processing the substrate, the apparatus comprising:

- a plurality of processing modules configured to process the substrate;
- a transfer mechanism configured to transfer the substrate ejected from the transfer container;
- a controller configured to output control signals for sequentially transferring the substrate to the plurality of processing modules along a previously set transfer path through the transfer mechanism, and process the substrate in the processing module of a transfer destination based on a processing recipe defining operational contents for processing to be performed on the substrate in which a processing order and a processing condition are set, and
- a setting unit configured to set contents of non-recipe operations independently from the processing recipe, which are operations except for the operation contents of the processing recipe and defines the non-recipe operations of the respective processing modules, and a performing timing for performing the non-recipe operations by a control operation of the controller for every processing module,
- wherein the performing timing is a timing selected from a time period ranging from a time that the transfer container is carried-into the carry-in port to a time that a processed substrate is delivered to the transfer container and then the transfer container is carried-out from the carry-in port,
- wherein the setting unit includes:
  - a plurality of tables defining a combination of the contents of the non-recipe operations and the performing timing;
  - a storage unit in which the plurality of tables having different combinations from each other of the non-recipe operations are made in every processing module;
  - a selection unit configured to select one table from the plurality of tables within the storage unit in the respective processing modules; and
  - an input unit configured to allow users to edit the selected table even during operations of the processing modules,
- wherein the non-recipe operations are performed in the processing modules based on contents defined in the selected table, and
- wherein the contents of the non-recipe operations includes:
  - performing conditions defining criteria to determine whether or not it is necessary to perform the non-recipe operations,
  - a performing period defining an interval determining the necessity to perform the non-recipe operations, the interval of the performing period is selected from every carrier and every wafer by editing the selected table using the input unit, and a maintenance macro defining contents of the operations carried out by the non-recipe operations, the contents of the operations include operational commands, setting values, and performing orders of a plurality of commands for the processing modules according to the criteria of the non-recipe operations defined by the performing conditions.

2. The substrate processing apparatus of claim 1, wherein the plurality of processing modules include various kinds of the processing modules configured to perform different kinds of processes from each other.

3. The substrate processing apparatus of claim 1, further comprising a transfer module installed in the transfer path between the carry-in port and the processing modules and configured to transfer the substrate, wherein the setting unit is configured to set the contents and the performing timing of the non-recipe operations in every module in a module group including the processing modules and the transfer module.

4. The substrate processing apparatus of claim 1, wherein the contents of the non-recipe operations include operational steps, which are an order of the non-recipe operations, and a condition for starting the non-recipe operations.

5. The substrate processing apparatus of claim 4, wherein the contents of the non-recipe operations include a condition for starting the non-recipe operations, wherein the condition for starting the non-recipe operation is selected from a plurality of conditions, and wherein one of the plurality of conditions includes a predetermined value about the number of sheets of the substrate processed in the processing module in which the non-recipe operations are performed.

6. The substrate processing apparatus of claim 1, wherein the plurality of processing modules are connected to a common transfer chamber within which the transfer mechanism is installed.

* * * * *